(12) United States Patent
Suzuki et al.

(10) Patent No.: US 9,483,073 B2
(45) Date of Patent: Nov. 1, 2016

(54) DISPLAY APPARATUS INCLUDING VIBRATION GENERATING SECTION

(71) Applicant: Alpine Electronics, Inc., Tokyo (JP)

(72) Inventors: Yukio Suzuki, Iwaki (JP); Shuhei Shinohara, Iwaki (JP)

(73) Assignee: ALPINE ELECTRONICS, INC., Tokyo (JP)

( * ) Notice: Subject to any disclaimer, the term of this patent is extended or adjusted under 35 U.S.C. 154(b) by 133 days.

(21) Appl. No.: 14/064,601

(22) Filed: Oct. 28, 2013

(65) Prior Publication Data

US 2014/0139983 A1 May 22, 2014

(30) Foreign Application Priority Data

Nov. 22, 2012 (JP) ................................ 2012-255911

(51) Int. Cl.
| | |
|---|---|
| H05K 5/00 | (2006.01) |
| G06F 1/16 | (2006.01) |
| G02F 1/1333 | (2006.01) |
| H05K 7/20 | (2006.01) |

(52) U.S. Cl.
CPC ....... *G06F 1/1601* (2013.01); *G02F 1/133308* (2013.01); *G02F 2001/133317* (2013.01); *G06F 1/1637* (2013.01); *G06F 1/1656* (2013.01); *H05K 7/20954* (2013.01)

(58) Field of Classification Search
CPC .................. G02F 1/133308; G02F 2201/503; G02F 2001/133317; G06F 3/016; G06F 1/1637; G06F 1/1601; G06F 1/1656; G06F 2200/1612; H04M 1/0266; H05K 7/20954
USPC ......... 361/679.01, 679.21, 679.3; 455/575.1, 455/575.9; 349/58, 60; 345/173
See application file for complete search history.

(56) References Cited

U.S. PATENT DOCUMENTS

| | | | |
|---|---|---|---|
| 7,933,122 B2 * | 4/2011 | Richardson et al. .... | 361/679.55 |
| 2006/0232564 A1 * | 10/2006 | Nishimura et al. ........... | 345/173 |
| 2011/0002112 A1 * | 1/2011 | Hsu et al. ..................... | 361/829 |
| 2011/0053653 A1 * | 3/2011 | Tho et al. ..................... | 455/566 |
| 2011/0102341 A1 * | 5/2011 | Imai et al. .................... | 345/173 |
| 2011/0102343 A1 * | 5/2011 | Imai et al. .................... | 345/173 |
| 2014/0029207 A1 | 1/2014 | Beraud | |

FOREIGN PATENT DOCUMENTS

| | | |
|---|---|---|
| JP | S62-169217 | 7/1987 |
| JP | 2011-040025 | 2/2011 |
| JP | 2011-096183 | 5/2011 |
| JP | 2011-107766 | 6/2011 |
| JP | 2012-094109 | 5/2012 |
| WO | WO2012131192 | 10/2012 |

OTHER PUBLICATIONS

First Office Action for JP2012-255911 mailed Jun. 21, 2016, 6 pgs.

\* cited by examiner

*Primary Examiner* — James Wu
(74) *Attorney, Agent, or Firm* — Brinks Gilson & Lione (57) ABSTRACT

A light-transmitting panel is disposed in front of a display panel, and an elastic frame surrounding a display screen is disposed between the display panel and the light-transmitting panel. The elastic frame includes a high-density frame region with an increased compression and a low-density frame region with a compression lower than that of the high-density frame region. Most of the portions of the light-transmitting panel are supported by a low-density frame region.

13 Claims, 6 Drawing Sheets

DISPLAY APPARATUS INCLUDING VIBRATION GENERATING SECTION

RELATED APPLICATION

The present application claims priority to Japanese Patent Application Number 2012-255911, filed Nov. 22, 2012, the entirety of which is hereby incorporated by reference.

BACKGROUND

1. Field of the Invention

The present invention relates to a display apparatus in which a light-transmitting panel that covers a display screen is vibrated by a vibration generating section and relates to a display apparatus having a structure in which the density of an elastic frame that supports a light-transmitting panel is partially increased.

2. Description of the Related Art

Japanese Unexamined Patent Application Publication No. 2011-107766 discloses technology relating to a structure for holding a touch screen. In this holding structure, a glass substrate including the touch screen is arranged in the front of a display panel. The glass substrate is supported above the display panel by a support frame made of resin or rubber. A piezoelectric element for providing vibrations for feedback at the time of operation is fixed to the glass substrate.

Providing the resin or rubber support frame between the display panel and the glass substrate reduces the attenuation of vibrations given to the glass substrate by the piezoelectric element and helps prevent dust and water drops from entering the space between the display panel and the glass substrate.

In actuality, however, it is difficult to achieve both the function of suppressing the attenuation of vibrations and the dustproof function and waterproof function. To suppress the attenuation of vibrations on the glass substrate, it is necessary to make the support frame out of an elastic material having a low modulus of elasticity. One of the optimal choices for such a material is an elastic foam material, such as a polyurethane foam material. However, the elastic foam material is insufficient for preventing entry of dust and water drops. In contrast, if the support frame is made of an elastic material having a high density, a vibration force occurring in the glass substrate is low.

Japanese Unexamined Patent Application Publication No. 2012-94109 discloses technology relating to a display apparatus with an input function. In this display apparatus, a touch screen is arranged in front of a liquid crystal display panel, and the touch screen is supported by a support. The support is made of a rubber material, is formed so as to surround the liquid crystal display panel, and achieves the dustproof function and waterproof function.

The support includes a first part and a second part. The second part is set such that its flexure is smaller than that of the first part. This technology aims to enable the touch screen to be sufficiently bent by a vibration force of a vibrator by the use of arrangement of the second part, whose flexure is smaller, at each of the four corners of the touch screen.

However, in the technology described in Japanese Unexamined Patent Application Publication No. 2012-94109, the support has different cross-sectional shapes in the first part and the second part, and the support is made of different elastic materials in the first part and the second part. This means that the shape and structure of the support are complicated. In addition, because the first part and the second part are discontinuous, the dustproof function and waterproof function may be unsatisfactory in the discontinuous portion.

SUMMARY

Accordingly, it is an object of an embodiment of the present invention to provide a display apparatus including a vibration generating section and capable of enhancing both a function of vibrating a light-transmitting panel and a dustproof function by partially changing the density in an elastic frame supporting the light-transmitting panel.

A display apparatus according to an embodiment of the present invention includes a display panel, a cover member, a light-transmitting panel, an elastic frame, and a vibration generating section. The display panel includes a display screen. The cover member surrounds a periphery of the display screen. The light-transmitting panel covers an area located in front of the display screen. The elastic frame is made of a material deformable by compression, disposed between the cover member and the light-transmitting panel, surrounding the periphery of the display screen, and elastically supporting the light-transmitting panel. The vibration generating section is configured to provide the light-transmitting panel with vibrations. The elastic frame includes a high-density frame region with an increased compression and a low-density frame region with less compression than that of the high-density frame region.

The elastic frame may preferably be made of an elastic foam material.

The display apparatus may further include a decorative panel including a display window that is located in front of the light-transmitting panel and that is opposite the display screen. The high-density frame region may be arranged near a hole, a gap, or an opening disposed in a vicinity of the display window in the decorative panel.

The high-density frame region may preferably be positioned between the hole, the gap, or the opening and the display window when the display apparatus is viewed from the front.

The elastic frame may be formed to a consistent thickness as a whole, the elastic frame may be provided with an auxiliary member superposed on a back surface or a front surface thereof in the high-density frame region and may be partially compressed in the high-density frame region. Alternatively, the elastic frame may be formed to a consistent thickness as a whole, the cover member may include a protrusion in a region corresponding to the high-density frame region, and the elastic frame may be superposed on the protrusion and be partially compressed in the high-density frame region.

The cover member may include an opening and a frame section. The opening may allow the elastic frame to project frontward. The frame section may cover an outer portion around the display screen in the display panel and may be positioned around the elastic frame. The frame section may include a front surface on which a plurality of fixed elastic blocks is disposed. The light-transmitting panel may be fixed to both a front surface of the elastic frame and a front surface of each of the fixed elastic blocks.

Each of the fixed elastic blocks may preferably be made of a material having a higher modulus of elasticity in its compression direction than that of the elastic frame.

The light-transmitting panel may include an input function section. The input function section may be directly joined to the light-transmitting panel or may have a structure in which a sensor is disposed in the vicinity of the light-transmitting panel, and the sensor is configured to sense contact of a finger or the like on the light-transmitting panel.

Embodiments of the present invention may include the high-density frame region and the low-density frame region in the elastic frame supporting the light-transmitting panel. This can enable the rigidity for supporting the light-transmitting panel to be increased in part and enable the light-transmitting panel to be supported with a satisfactory modulus of elasticity, while using the elastic frame having a low modulus of elasticity as a whole. Because the dustproof function and waterproof function can be enhanced in the high-density frame region, even when the elastic frame having the low modulus of elasticity as a whole is used, the possibility of entry of dust and other objects into the space between the display panel and the light-transmitting panel can be reduced. In particular, the dustproof function and waterproof function can be sufficiently enhanced by arrangement of the high-density frame region in a portion that tends to receive dust and moisture, for example, in a lower region of the display apparatus or in a position close to or opposite to the gap, hole, or opening in the decorative panel.

Because the high-density frame region and the low-density frame region are formed simply by partially changing the compressibility of the elastic frame, it is easy to form the high-density frame region and the low-density frame region. In addition, because the high-density frame region and the low-density frame region are continuous, satisfactory dustproof function can be maintained.

DESCRIPTION OF THE PRESENTLY PREFERRED EMBODIMENTS

Figure 1:
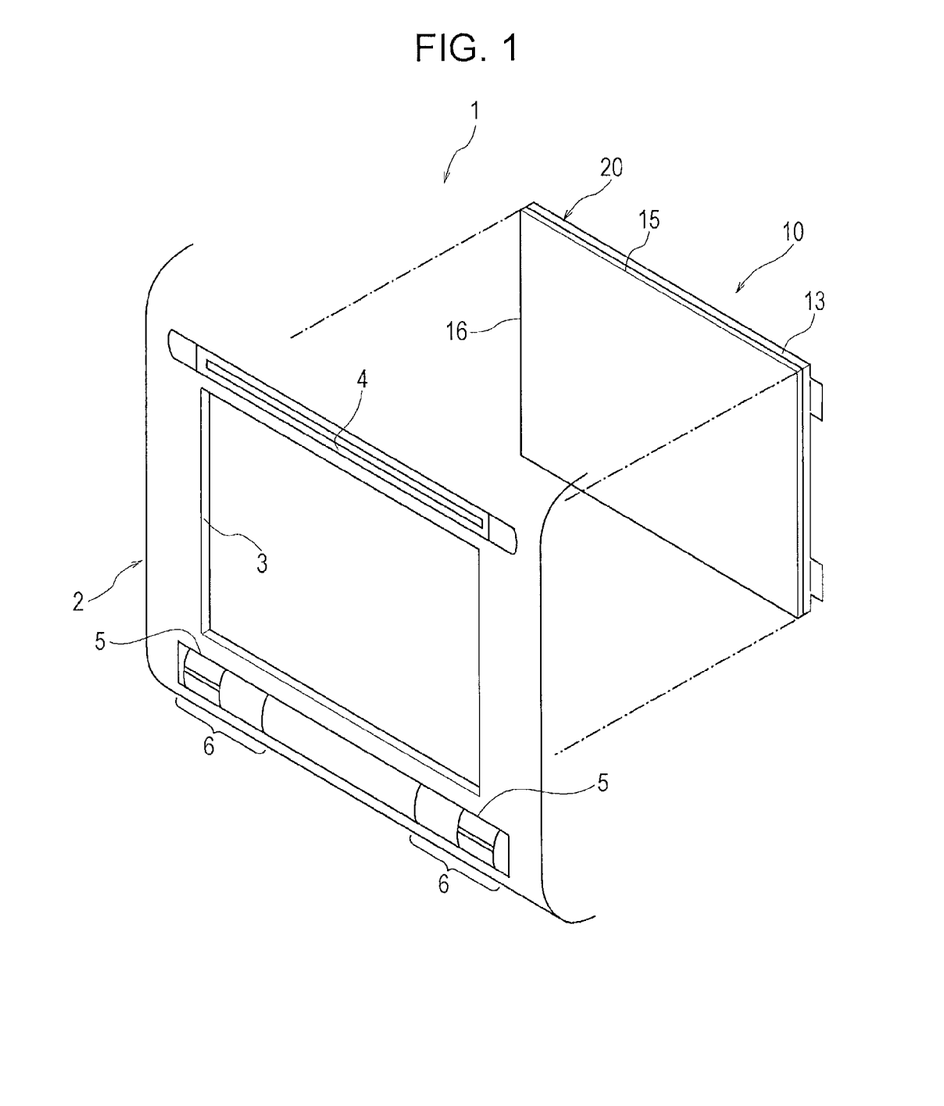
FIG. 1 is a partly exploded perspective view that illustrates a display apparatus according to an embodiment of the present invention.
Figure 2:
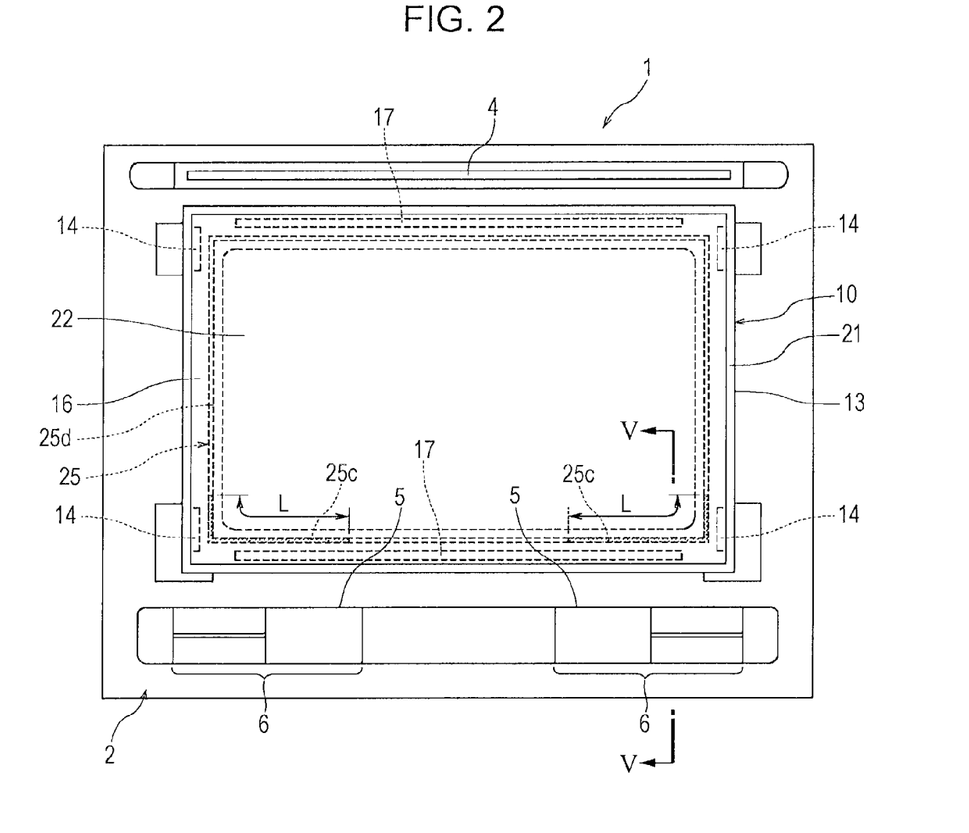
FIG. 2 is a front view of the display apparatus according to the embodiment of the present invention.

FIGS. 1 and 2 illustrate a display apparatus 1 for automotive use according to a first embodiment of the present invention.

A decorative panel 2 illustrated in FIG. 1 is a part of an instrument panel in a compartment in an automobile. The decorative panel 2 has a display window 3. A display unit 10 visible within the area of the display window 3 is fixed inside the decorative panel 2.

Figure 5:
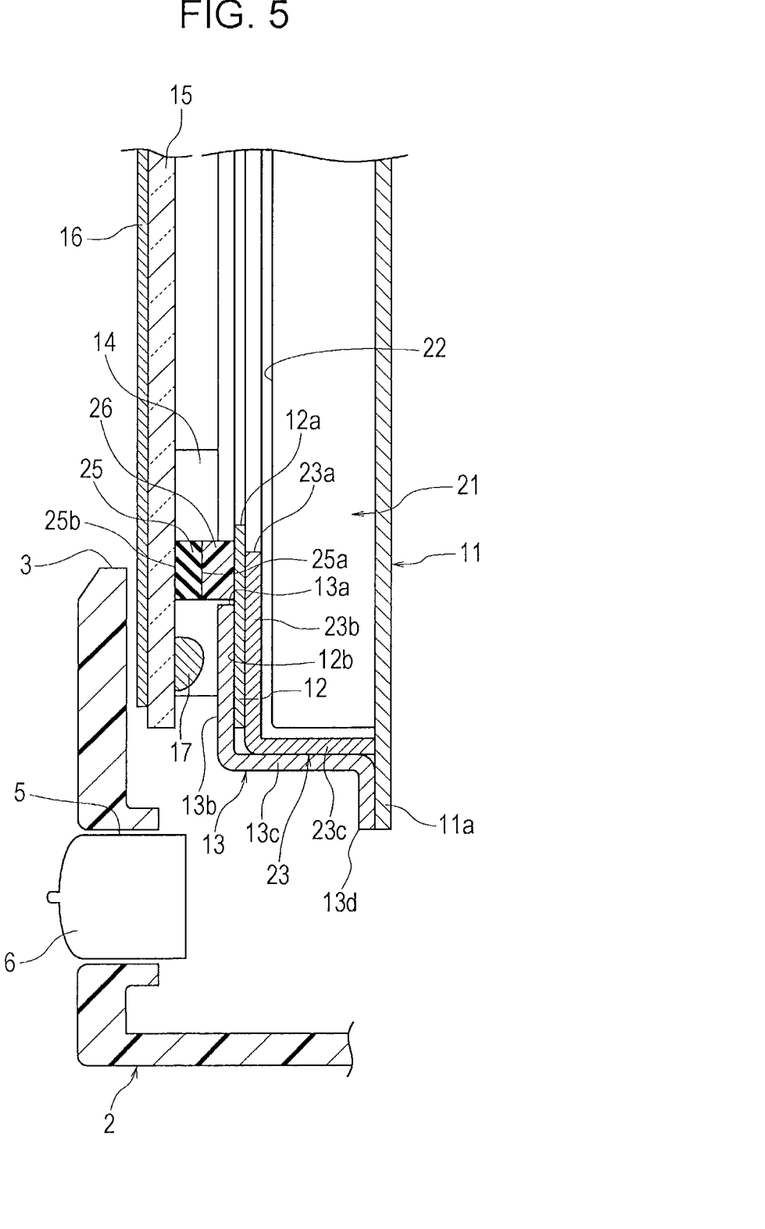
FIG. 5 is a cross-sectional view taken along the line V-V in the display apparatus illustrated in FIG. 2.

The decorative panel 2 has a disk insertion slot 4 above the display window 3. A disk driving device is disposed behind the disk insertion slot 4 inside the decorative panel 2. Operating sections 6 are arranged in left and right side portions below the display window 3. As illustrated in FIG. 5, a gap 5 is present between the decorative panel 2 and each of the operating sections 6. Examples of the operating section 6 can include a push button, a selectable push button operating in a see-saw manner, and a rotatable operation knob.

Figure 3:
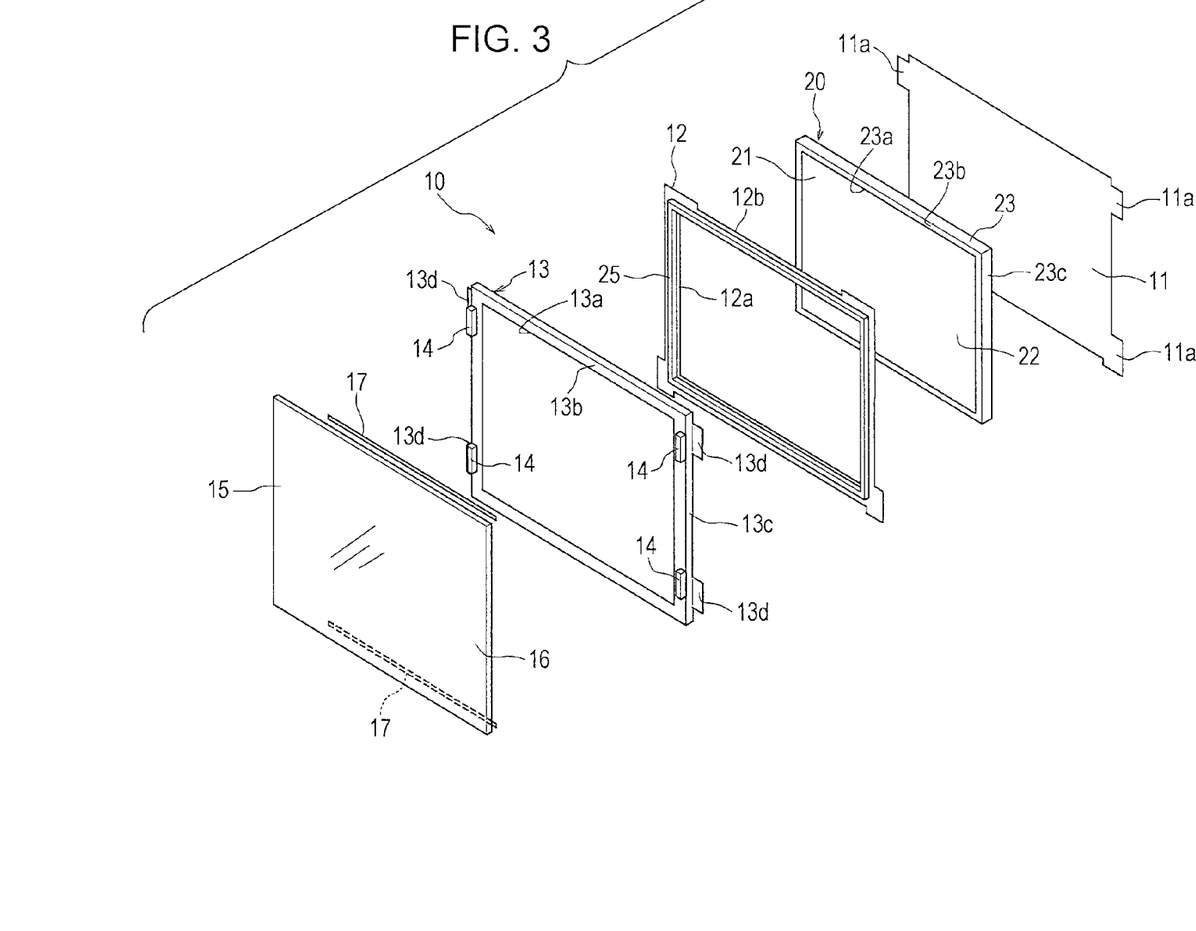
FIG. 3 is an exploded perspective view of a display unit included in the display apparatus.

As illustrated in FIGS. 3 and 5, the display unit 10 includes a support substrate 11. The support substrate 11 is made of a metal plate. The support substrate 11 includes mounting extensions 11a integrally formed therewith. The mounting extensions 11a project laterally. The mounting extensions 11a are fixed to a frame inside the decorative panel 2.

A display panel 20 is fixed to the front surface of the support substrate 11. Examples of the display panel 20 can include a liquid crystal display panel and an electroluminescent display panel. The display panel 20 includes a panel main body 21 and a display screen 22 disposed on the front surface of the panel main body 21. The panel main body 21 is covered with an inner cover member 23. The inner cover member 23 is made of a metal plate and includes an opening 23a allowing the display screen 22 to be exposed, a frame section 23b fully covering the peripheral portion of the display screen 22, and a side board section 23c covering the four sides of the panel main body 21.

Figure 4:
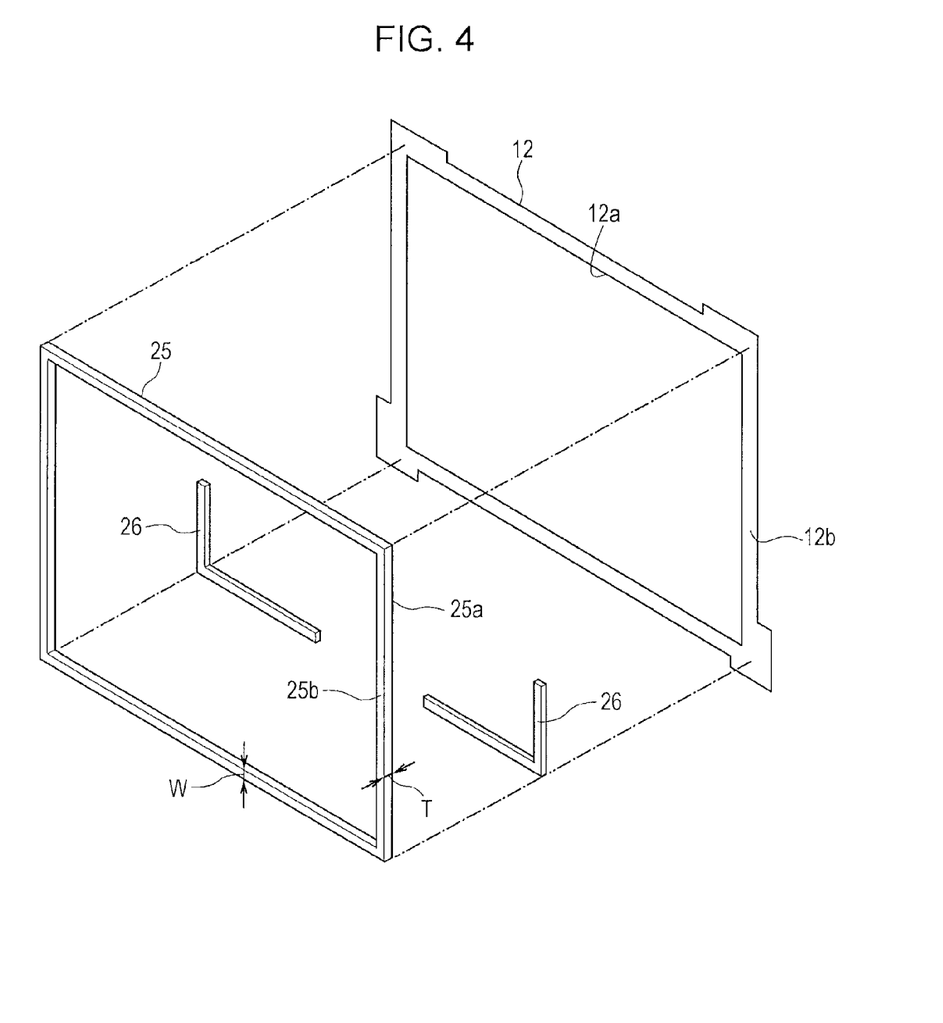
FIG. 4 is an exploded perspective view of components that form a part of the display unit.

A support sheet 12 is arranged in front of the display panel 20. As illustrated in FIG. 4, the support sheet 12 is made of a synthetic resin material and has a frame shape with a substantially rectangular opening 12a. The support sheet 12 is disposed on the front surface of the inner cover member 23 in the display panel 20 and is arranged so as to surround the outer portion of the display screen 22.

As illustrated in FIGS. 3 and 4, an elastic frame 25 is fixed to the front surface of the support sheet 12. The elastic frame 25 has a bulk modulus, is deformable by compression, and can be made of a material such as synthetic rubber or natural rubber. The elastic frame 25 may preferably be made of an elastic foam material having a low modulus of elasticity as a whole. Examples of such an elastic foam material can include a resin foam material, such as a polyurethane foam material, and a rubber foam material. The elastic frame 25 is a substantially rectangular frame that surrounds the opening 12a in the support sheet 12.

The elastic frame 25 illustrated in FIGS. 3 and 4 is formed such that the entire frame shape is integrally formed of a resin foam material. The elastic frame 25 may have a frame shape in which substantially L-shaped sections and/or substantially linear sections are combined. The elastic frame 25 may have a frame shape with curved corners.

The elastic frame 25 has a substantially constant thickness dimension T in the longitudinal direction throughout its perimeter and has a substantially uniform inner density throughout its perimeter. The substantially uniform density used here means that no particular processing through which a change occurs in inner density is performed at the time of shaping the elastic frame 25. The width dimension (width dimension in a plane direction substantially parallel with the display screen 22) W of the elastic frame 25 may vary depending on the position. In the embodiment illustrated in FIG. 4, the width dimension W is substantially uniform throughout its perimeter of the elastic frame 25.

As illustrated in FIG. 4, auxiliary members 26 are disposed between part of the elastic frame 25 and the support sheet 12. The auxiliary members 26 are superposed on the corners in the lower left and right side portions of the elastic frame 25. Each of the auxiliary members 26 is substantially L-shaped along the corner. The auxiliary member 26 can be made of a synthetic resin material having a rigidity at which it is practically impossible to elastically contract in the thickness direction. The auxiliary member 26 may also be made of an elastic material having a higher modulus of elasticity in the compression direction than that of the elastic frame 25. The auxiliary member 26 may also be made of the same elastic material as that of the elastic frame 25.

The auxiliary member 26 may be fixed to a front surface 12b of the support sheet 12 with an adhesive. A back surface 25a of the elastic frame 25 may be bonded and fixed to both the front surface 12b of the support sheet 12 and the auxiliary members 26.

As illustrated in FIGS. 3 and 5, an outer cover member 13 may be disposed in front of the support sheet 12. The outer cover member 13 is made of a metal plate and includes a substantially rectangular opening 13a allowing the elastic frame 25 to project frontward, a frame section 13b fully covering the outer portion around the display screen 22 and positioned around the elastic frame 25, and a side board section 13c covering the four side portions of the inner cover member 23 disposed in the display panel 20. The side board section 13c on each of the left and right sides is provided with support extensions 13d integrally formed therewith and bent from the edges facing the rear.

As illustrated in FIG. 3, fixed elastic blocks 14 are bonded and fixed to the front surface of the frame section 13b in the outer cover member 13. The fixed elastic blocks 14 are made of a synthetic rubber material or a resin foam material deformable by compression. The fixed elastic blocks 14 preferably may be made of a material having a higher modulus of elasticity in the compression direction than that of the elastic frame 25. The fixed elastic blocks 14 may be small pieces and provided in four locations. The total size of the front surfaces of the four fixed elastic blocks 14 is substantially smaller than the size of a front surface 25b of the elastic frame 25.

A light-transmitting panel 15 is bonded and fixed to both the front surface of the elastic frame 25 and the front surface of each of the fixed elastic blocks 14. The light-transmitting panel 15 can be a glass substrate or a transparent synthetic resin substrate such as a polycarbonate. As illustrated in FIG. 5, a sensing panel including an input function section 16 may be joined to the front surface of the light-transmitting panel 15. The sensing panel includes a transparent sheet and a transparent electrode. The sensing panel is configured to sense a coordinate position where a finger or other object comes into contact therewith as a change in electrical resistance or configured to sense a coordinate of a position where a finger or other object becomes close thereto as a change in capacitance, for example.

Vibration generating sections 17 may be bonded and fixed to the back surface of the light-transmitting panel 15 in locations along the upper and lower edge portions. Each of the vibration generating sections 17 includes an elongated piezoelectric element and an electrode. When the electrode receives an alternating current signal, the piezoelectric element generates flexural vibrations in the thickness direction.

FIG. 5 illustrates an assembled structure of members included in the display unit 10 in cross-sectional view.

In the display unit 10, the display panel 20 is fixed to the front surface of the support substrate 11, and the support sheet 12 is disposed on the front surface of the frame section 23b of the inner cover member 23 included in the display panel 20. The support sheet 12 may preferably be fixed to the front surface of the frame section 23b with an adhesive, but it may not be fixed thereon.

The outer cover member 13 is disposed in front of the support sheet 12. The elastic frame 25, which is fixed to the support sheet 12, projects frontward through the opening 13a of the outer cover member 13. The support sheet 12 is disposed between the frame section 23b of the inner cover member 23 and the frame section 13b of the outer cover member 13. The outer region of the side board section 23c of the inner cover member 23 is covered with the side board section 13c of the outer cover member 13. The support extensions 13d of the outer cover member 13 are fixed to the frame together with the mounting extensions 11a of the support substrate 11.

The back surface of the light-transmitting panel 15 is bonded to and supported by the front surfaces of the fixed elastic blocks 14, which are disposed on the frame section 13b of the outer cover member 13. The back surface of the light-transmitting panel 15 is also bonded and fixed to the front surface 25b of the elastic frame 25, which projects frontward through the opening 13a of the outer cover member 13. The entire perimeter of the elastic frame 25 is bonded and fixed to the light-transmitting panel 15.

Because the light-transmitting panel 15 is fixed to the front surfaces of the fixed elastic blocks 14 at the four locations, the distance between the light-transmitting panel 15 and the frame section 13b of the outer cover member 13 in the longitudinal direction is virtually uniform. The elastic frame 25 is strongly compressed in the longitudinal direction in the two locations where the auxiliary members 26 are superposed.

As a result, the elastic frame 25 has a high compression in the longitudinal direction in the regions where the auxiliary members 26 are superposed. As illustrated in FIG. 2, the regions having L length ranges are high-density frame regions 25c having a high density in elastic material, whereas the regions other than the L length ranges are low-density frame regions 25d having a lower density in elastic material than that of the high-density frame regions 25c.

As illustrated in FIG. 5, the vibration generating section 17 fixed to the back surface of the light-transmitting panel 15 is arranged outside the outer portion of the elastic frame 25. When the display unit 10 is placed on the inner surface of the decorative panel 2, the light-transmitting panel 15 is behind the inside of the display window 3 of the decorative panel 2, and the display screen 22 in the display panel 20 is behind the display window 3.

The display apparatus 1 for automotive use can receive various operational inputs from a user who operates the input function section 16 with a finger or other object while seeing an image appearing on the display screen 22 in the display panel 20 through the display window 3. A control device (not illustrated) provides the vibration generating section 17 with a driving signal on the basis of an operation signal input through the input function section 16. The vibration generating section 17 generates flexural vibrations in its thickness direction. The vibrations are provided to the light-transmitting panel 15. In this way, the finger or other object operating the input function section 16 can feel feedback vibrations.

Because the light-transmitting panel 15 is bonded to and elastically supported by the front surface of each of the fixed elastic blocks 14 and the front surface 25b of the elastic frame 25, the light-transmitting panel 15 can be vibrated by the flexural vibrations of the vibration generating section 17.

The elastic frame 25 has the function of suppressing entry of dust and moisture into the space between the display screen 22 and the light-transmitting panel 15. Thus the elastic frame 25 is required to have a frame shape that fully surrounds the periphery of the display screen 22. It is to be noted that, although the elastic frame 25, whose perimeter is long, is bonded to the back surface of the light-transmitting panel 15, because the elastic frame 25 is made of an elastic foam material having a low modulus of elasticity, the force of restraining the light-transmitting panel 15 is small. Accordingly, the light-transmitting panel 15 can be vibrated with relatively large amplitude by flexural vibrations of the vibration generating section 17.

The elastic frame 25 is compressed and forms the high-density frame regions 25c in the L ranges illustrated in FIG. 2. Most of the regions of the elastic frame 25 are the low-density frame regions 25d, which are soft and have a low modulus of elasticity and a low rigidity. However, providing the high-density frame regions 25c in part can prevent significant decrease in the support rigidity while supporting the light-transmitting panel 15 in a state where it can be easily vibrated. Accordingly, repulsion occurring when the input function section 16 is pressed by a finger can be strong to some extent.

The inclusion of the high-density frame regions 25c in the elastic frame 25, which is made of an elastic foam material, can enhance the dustproof function in these regions and thus helps prevent dust from entering the space located in front of the display screen 22 as a whole. In particular, when the high-density frame regions 25c are in the lower portion in the elastic frame 25, this facilitate preventing entry of dust rising from the below into the space located in front of the display screen 22.

As illustrated in FIGS. 1, 2, and 5, the high-density frame regions 25c are opposite the gaps 5 in the decorative panel 2 and, when the display apparatus 1 for automotive use is viewed from the front, the high-density frame regions 25c are positioned between the display window 3 and the gaps 5. Thus the high-density frame regions 25c facilitates preventing dust or the like getting into the decorative panel 2 through the gaps 5 from entering the space located in front of the display screen 22. In addition, because the elastic frame 25, which supports the light-transmitting panel 15, has a low modulus of elasticity as a whole, the light-transmitting panel 15 is supported in a state where it can be easily vibrated.

As described above, the high-density frame regions 25c may preferably be provided in part in the lower portion of the elastic frame 25 or may be arranged in a location opposite or close to the gap, hole, or opening in the decorative panel 2.

Figure 6:
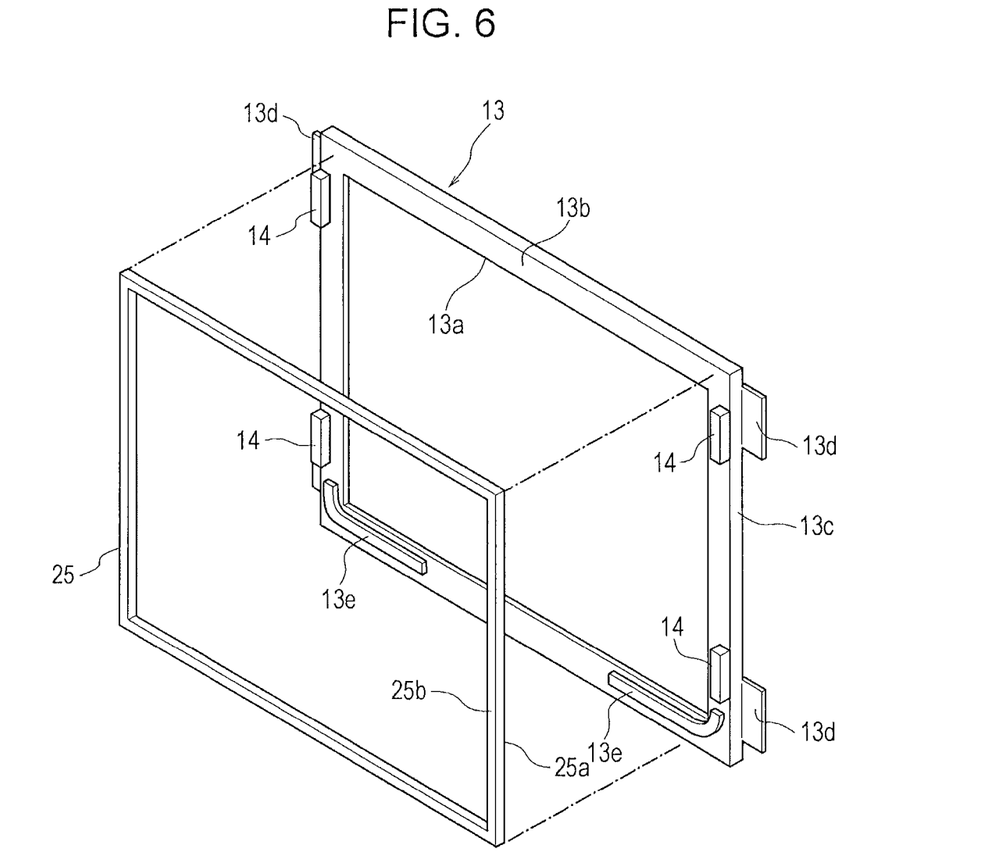
FIG. 6 illustrates a second embodiment of the present invention and is an exploded perspective view of components that form a part of a display unit.

A second embodiment illustrated in FIG. 6 does not include the support sheet 12. The front surface of the frame section 13b of the outer cover member 13 is bonded and fixed to both the elastic frame 25 and the fixed elastic blocks 14.

The outer cover member 13 includes protrusions 13e on both of the corners in the lower portion of the frame section 13b. The protrusions 13e are metal plates protruding frontward. Part of the elastic frame 25 is superposed on the protrusions 13e and is bonded and fixed thereto. The elastic frame 25 has the substantially constant thickness dimension T throughout its perimeter. When the light-transmitting panel 15 is bonded and fixed to the front surface of each of the elastic frame 25 and the fixed elastic blocks 14, the elastic frame 25 is compressed in the longitudinal direction in the portions on which the protrusions 13e are disposed and forms the high-density frame regions 25c.

In the present invention, the auxiliary members 26 illustrated in FIG. 4 may be fixed to the back surface of the light-transmitting panel 15. Alternatively, the thickness dimension T of the elastic frame 25 may be larger in part, and when the elastic frame 25 is placed between the cover member and the light-transmitting panel, the portion having the larger thickness dimension T may be compressed with a high compression and form a high-density frame region.

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:

1. A display apparatus comprising:
    a display panel that includes a display screen disposed on a front surface of the display panel;
    a cover member that overlaps and covers a periphery of the display screen;
    a light-transmitting panel that covers an area located in front of the display screen;
    a decorative panel including a display window that is located in front of the light-transmitting panel and that is opposite the display screen;
    an elastic frame made of a material deformable by compression, sandwiched in compression between a front surface of the cover member and a back surface of the light-transmitting panel, fully surrounding the periphery of the display screen, and elastically supporting the light-transmitting panel; and
    a vibration generating section configured to provide the light-transmitting panel with vibrations,
    wherein the elastic frame is in compression around the entire periphery of the display screen and includes a high-density frame region compressed by the cover member and the light-transmitting panel with an increased compression and a low-density frame region compressed by the cover member and the light-transmitting panel with a compression lower than that of the high-density frame region, the high-density frame region of the elastic frame being compressed with increased compression by an auxiliary member superposed on a back surface or a front surface of the elastic frame in the high-density frame region, or a protrusion in a region of the cover member corresponding to the high-density frame region, and the high-density frame region is arranged near a hole, a gap, or an opening disposed in a vicinity of the display window in the decorative panel.

2. The display apparatus according to claim 1, wherein the elastic frame is made of an elastic foam material.

3. The display apparatus according to claim 1, wherein the high-density frame region is positioned between the hole, the gap, or the opening and the display window when the display apparatus is viewed from the front.

4. The display apparatus according to claim 1, wherein the elastic frame is formed to a consistent thickness.

5. The display apparatus according to claim 1, wherein the cover member includes an opening and a frame section, the opening allowing the elastic frame to project frontward, the frame section covering an outer portion around the display screen in the display panel and being positioned around the elastic frame,
    the frame section includes a front surface on which a plurality of fixed elastic blocks are disposed, and the light-transmitting panel is fixed to both a front surface of the elastic frame and a front surface of each of the fixed elastic blocks.

6. The display apparatus according to claim 5, wherein each of the fixed elastic blocks is made of a material having a higher modulus of elasticity in its compression direction than that of the elastic frame.

7. The display apparatus according to claim 1, wherein the light-transmitting panel includes an input function section.

8. A display apparatus comprising:
- a display panel that includes a display screen disposed on a front surface of the display panel;
- a cover member that overlaps and covers a periphery of the display screen;
- a light-transmitting panel that covers an area located in front of the display screen;
- a decorative panel including a display window that is located in front of the light-transmitting panel and that is opposite the display screen,
- an elastic frame made of a material deformable by compression, sandwiched in compression between a front surface of the cover member and a back surface of the light-transmitting panel, fully surrounding the periphery of the display screen, and elastically supporting the light-transmitting panel; and
- a vibration generating section configured to provide the light-transmitting panel with vibrations,
- wherein the elastic frame is in compression around the entire periphery of the display screen and includes a high-density frame region compressed by the cover member and the light-transmitting panel with an increased compression and a low-density frame region compressed by the cover member and the light-transmitting panel with a compression lower than that of the high-density frame region, the high-density frame region of the elastic frame being compressed with increased compression by an auxiliary member superposed on a back surface or a front surface of the elastic frame in the high-density frame region, or a protrusion in a region of the cover member corresponding to the high-density frame region, and the high-density frame region is arranged near a hole, a gap, or an opening disposed in a vicinity of the display window in the decorative panel,
- the cover member includes an opening and a frame section, the opening allowing the elastic frame to project frontward, the frame section covering an outer portion around the display screen in the display panel and being positioned around the elastic frame,
- the frame section includes a front surface on which a plurality of fixed elastic blocks are disposed, and
- the light-transmitting panel is fixed to both a front surface of the elastic frame and a front surface of each of the fixed elastic blocks.

9. The display apparatus according to claim 8, wherein the elastic frame is made of an elastic foam material.

10. The display apparatus according to claim 8, wherein each of the fixed elastic blocks is made of a material having a higher modulus of elasticity in its compression direction than that of the elastic frame.

11. The display apparatus according to claim 8, wherein the high-density frame region is positioned between the hole, the gap, or the opening and the display window when the display apparatus is viewed from the front.

12. The display apparatus according to claim 8, wherein the elastic frame is formed to a consistent thickness.

13. The display apparatus according to claim 8, wherein the light-transmitting panel includes an input function section.

* * * * *